(12) United States Patent
Ishizaka et al.

(10) Patent No.: US 8,372,739 B2
(45) Date of Patent: Feb. 12, 2013

(54) DIFFUSION BARRIER FOR INTEGRATED CIRCUITS FORMED FROM A LAYER OF REACTIVE METAL AND METHOD OF FABRICATION

(75) Inventors: Tadahiro Ishizaka, Watervliet, NY (US); Satohiko Hoshino, Delmar, NY (US); Kuzuhiro Hamamoto, Delmar, NY (US); Shigeru Mizuno, Delmar, NY (US); Yasushi Mizusawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1312 days.

(21) Appl. No.: 11/691,167

(22) Filed: Mar. 26, 2007

(65) Prior Publication Data

US 2008/0237859 A1 Oct. 2, 2008

(51) Int. Cl.
*H01L 21/4763* (2006.01)

(52) U.S. Cl. ........ 438/597; 438/625; 438/629; 438/643; 438/644; 438/656; 257/774; 257/E21.575; 257/E21.577; 257/E21.578; 257/E21.579; 257/E21.584; 257/E21.585

(58) Field of Classification Search .......... 257/762, 257/773, 774, E21.575, E21.577, E21.578, 257/E21.579, E21.584, E21.585; 438/686, 438/687, 597, 618, 622, 642, 652, 625, 629, 438/643, 644, 656
See application file for complete search history.

(56) References Cited

U.S. PATENT DOCUMENTS

| | | |
|---|---|---|
| 6,444,263 B1 | 9/2002 | Paranjpe et al. |
| 6,833,625 B1 | 12/2004 | Wang et al. |
| 2003/0203617 A1* | 10/2003 | Lane et al. ................ 438/627 |
| 2005/0181598 A1* | 8/2005 | Kailasam ................ 438/654 |
| 2006/0113675 A1 | 6/2006 | Chang et al. |
| 2006/0249849 A1* | 11/2006 | Cohen .................... 257/758 |

OTHER PUBLICATIONS

J. Koike et al., "Cu Alloy Metallization for Self-forming Barrier Process", Interconnect Technology Conference, Jun. 2006, p. 161-163.
Iijima et al., "Growth Behavior of Self-Formed Barrier Using Cu-Mn Alloys at 350 to 600° C", Interconnect Technology Conference, Jun. 2006, p. 155-157.
Gosset et al., "Self Aligned Barrier Approach: Overview on Process, Module Integration and Interconnect Performance Improvement Challenges", Interconnect Technology Conference, Jun. 2006, p. 84-86.
Gross, M.E. et al., Journal of Vacuum Science and Technology B, American Vacuum Society, pp. 1548-1552, vol. 6, 1988.

(Continued)

*Primary Examiner* — Matthew Reames
*Assistant Examiner* — Ermias Woldegeorgis
(74) *Attorney, Agent, or Firm* — Wood, Herron & Evans, LLP

(57) ABSTRACT

An interconnect structure for an integrated circuit and method of forming the interconnect structure. The method includes depositing a metallic layer containing a reactive metal in an interconnect opening formed within a dielectric material containing a dielectric reactant element, thermally reacting at least a portion of the metallic layer with at least a portion of the dielectric material to form a diffusion barrier primarily containing a compound of the reactive metal from the metallic layer and the dielectric reactant element from the dielectric material, and filling the interconnect opening with Cu metal, where the diffusion barrier surrounds the Cu metal within the opening. The reactive metal can be Co, Ru, Mo, W, or Ir, or a combination thereof. The interconnect opening can be a trench, a via, or a dual damascene opening.

27 Claims, 9 Drawing Sheets

OTHER PUBLICATIONS

Maruyama T. et al., Cobalt thin films prepared by chemical vapor deposition from cobaltous acetate, Applied Physics Letters, American Institute of Physics, Melville, NY, pp. 1433-1434, vol. 59, Sep. 16, 1991.

Dormans, G.J.M., OMCVD of transition metal and their silicides using metallocenes and (di)silane or silicon tetrabromide, Journal of Crystal Growth, Elsevier Science Publishers B.V. (North Holland) pp. 806-816, vol. 108, 1991.

Ivanova, A.R. et al., The effects of processing parameters in the chemical vapor deposition of cobalt fom cobalt tricarbonyl nitrosyl, Journal of the Electrochemical Society, The Electrochemical Society, pp. 2139-2145, vol. 146, No. 6, 1999.

Lim, B.S. et al., Atomic layer deposition of transition metals, nature Materials, Nature Publishing Group, pp. 749-754, vol. 2, 2003.

Kang, S.B. et al., CVD-cobalt for the next generation of Source/Drain Salicidation and contact silicidation in novel MOS device structures with complex shape, IEEE International Electron Devices Meeting (IEDM), Washington DC, 4 pp., Dec. 8-10, 2003.

Bhandari, H. et al., Vapor deposition of barrier/adhesion/seed layers for copper interconnects, Materials Research Society, Spring Meeting, Mar. 25-27, 2008. (Abstract only).

Rhee, H.S. et al., Cobalt metallorganic chemical vapor deposition and formation of epitaxial CoSi2 layer on Si(100) substrate, Journal of the Electrochemical Society, The Electrochemical Society, Inc., pp. 2720-2724, vol. 146, No. 7, 1999.

Londergan A.R., et al., Interlayer mediated epitaxy of cobalt silicide on silicon(100) from low termperature chemical vapor deposition of cobalt, Journal of the Electrochemical Society, The Electrochemical Society, Inc., pp. C21-C27, vol. 148, No. 1, 2001.

Kim, K, Characteristics of cobalt thin films deposited by remote plasma ALD method and dicobalt octacarbonyl, Journal of the Electrochemical Society, The Electrochemical Society, Inc., pp. H177-H181, vol. 154, No. 3, 2007.

Lee, J. et al., Highly conformal deposition of pure Co films by MOCVD using Co2(CO)8 as a precursor, Journal of the Electrochemical Society, The Electrochemical Society, Inc., pp. G539-G542, vol. 153, No. 6, 2006.

Lee, K. et al., Characteristics of Ti-capped Co films deposited by a remote plasma ALD method using cyclopentadienylcobalt dicarbonyl, Journal of the Electrochemical Society, The Electrochemical Society, Inc., pp. H899-H903, vol. 154, No. 10, 2007.

Dormans, G.J.M. et al., OMCVD of cobalt and cobalt silicide, Journal of Crystal Growth, Elsevier Science Publishers B.V. (North Holland), pp. 364-372, vol. 114, 1991.

Maury, F. et al., Epitaxial growth of CoGa on GaAs by organometallic chemical vapor deposition, Chemistry of Materials, American Chemical Society, pp. 84-89, vol. 5, 1993.

Li, Z. et al., Nucleation and adhesion of ALD copper on cobalt adhesion layers and tungsten diffusion barriers, Electrochemical and solid-State Letters, The Electrochemical Society, Inc., pp. G182-G185, vol. 8, No. 7, 2005.

Lee, H.B.R. et al., Low resistivity cobalt thin films prepared by plasma-enhanced atomic layer deposition, AVS 6th International Conference on Atomic Layer Deposition (ALD 2006), Seoul, South Korea, Jul. 24-26, 2006, 21 pp.

U.S. Patent and Trademark Office, Non-final Office Action received in related U.S. Appl. No. 12/242,384 dated Aug. 21, 2009, 36 pp.

* cited by examiner

DIFFUSION BARRIER FOR INTEGRATED CIRCUITS FORMED FROM A LAYER OF REACTIVE METAL AND METHOD OF FABRICATION

FIELD OF THE INVENTION

The invention relates generally to fabrication of interconnect structures within integrated circuits, and more particularly, to using a layer of reactive metal for forming a diffusion barrier on dielectric materials within the integrated circuits.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

A long-recognized objective in the constant advancement of integrated circuit (IC) technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. As the width of metal lines is scaled down to smaller submicron and even nanometer dimensions, electromigration failure, which may lead to open and extruded metal lines, is now a well-recognized problem. Moreover, as dimensions of metal lines further decrease, metal line resistance increases substantially, and this increase in line resistance may adversely affect circuit performance.

The introduction of copper (Cu) metal into multilayer metallization schemes for manufacturing integrated circuits is enabled by the damascene Cu plating process and is now extensively used by manufacturers of advanced microprocessors and application-specific circuits. Cu is known to easily diffuse into common integrated circuit materials such as silicon and dielectric materials where Cu is a mid-bandgap impurity. Therefore, a diffusion barrier material is formed onto dielectric materials and other materials in the integrated circuits to surround the Cu and prevent diffusion of the Cu into the integrated circuit materials. As the line width of interconnect structures is continually decreased, the thickness of the diffusion barrier material needs to be reduced to minimize the volume of the diffusion barrier material within an interconnect feature containing the Cu metal fill. Minimizing the volume of the diffusion barrier material in turn maximizes the volume of the Cu metal fill. As is known to those skilled in the art, diffusion barrier materials generally have higher electrical resistance than the Cu metal fill. Thus, maximizing the volume of the Cu metal fill and minimizing the volume of the diffusion barrier material results in minimizing the electrical resistance of the interconnect structure.

SUMMARY OF THE INVENTION

An interconnect structure for an integrated circuit is provided and method of forming the interconnect structure. The interconnect structure contains an interconnect opening within a dielectric material having a diffusion barrier formed from a layer of a reactive metal that prevents diffusion of the Cu metal into the dielectric material, maximizes the volume of the Cu metal in the interconnect opening, and reduces Cu metal resistivity in the interconnect structure. The reactive metal is Co, Ru, Mo, W, or Ir, or a combination thereof.

According to one embodiment of the invention, the method includes depositing a metallic layer comprising a reactive metal in an interconnect opening formed within a dielectric material, where the dielectric material contains a dielectric reactant element; thermally reacting at least a portion of the metallic layer with at least a portion of the dielectric material to form a diffusion barrier primarily containing a compound of the reactive metal from the metallic layer and the dielectric reactant element from the dielectric material; and filling the interconnect opening with Cu metal, where the diffusion barrier surrounds the Cu metal within the interconnect opening.

According to one embodiment of the invention, the interconnect structure contains an interconnect opening formed within a dielectric material, a diffusion barrier on the dielectric material, where the diffusion barrier primarily contains a compound from a thermal reaction between a reactive metal of a metallic layer formed on the dielectric material and a dielectric reactant element from the dielectric material, and a Cu metal filling the interconnect opening, where the diffusion barrier surrounds the Cu metal within the interconnect opening.

DETAILED DESCRIPTION OF SEVERAL EMBODIMENTS OF THE INVENTION

Embodiments of the invention provide an interconnect structure for an integrated circuit and method of forming the interconnect structure. The interconnect structure includes a diffusion barrier that prevents diffusion of Cu metal into a dielectric material in an interconnect opening and maximizes the volume of Cu metal in the interconnect opening.

According to an embodiment of the invention, a metallic layer containing a reactive metal is deposited into the interconnect opening and thermally reacted with one or more dielectric reactant elements from a dielectric material in the interconnect opening to form a diffusion barrier for Cu metallization. According to embodiments of the invention, the thermal reaction is dominated by an interaction between the reactive metal from the metallic layer and the dielectric reactant element from the dielectric material. In other words, the dielectric material is the primary source of the dielectric reactant element in the resulting diffusion barrier. According to embodiments of the invention, a reactive metal element of the metallic layer is selected based on several requirements. The requirements include 1) the reactive metal being capable of thermally reacting with one or more dielectric reactant elements in the dielectric material to form a thin diffusion barrier that prevents diffusion of Cu metal into the dielectric material, 2) the reactive metal should be non-reactive towards Cu and immiscible in Cu, and 3) the reactive metal should offer low electrical resistivity. In view of these requirements, the inventors have specifically identified cobalt (Co), ruthenium (Ru), molybdenum (Mo), tungsten (W), or iridium (Ir), or a combination thereof, as being suitable reactive metal elements for the metallic layer.

According to one embodiment of the invention, the diffusion barrier may have thickness of 3 nm, or less, thereby maximizing the volume of Cu metal in the interconnect opening. According to one embodiment of the invention, the diffusion barrier may work as a seed layer for a Cu plating process where Cu metal is deposited directly onto the diffusion barrier to fill the interconnect opening. In another embodiment of the invention, a Cu or Ru seed layer may be deposited onto the diffusion barrier to enhance the Cu plating process and the electronic properties of the completed interconnect structure. In yet another embodiment of the invention, a first portion of a thickness of the metallic layer reacts with a dielectric reactant from the dielectric material while a second portion of the thickness of the metallic layer remains unreacted.

Figure 1A:
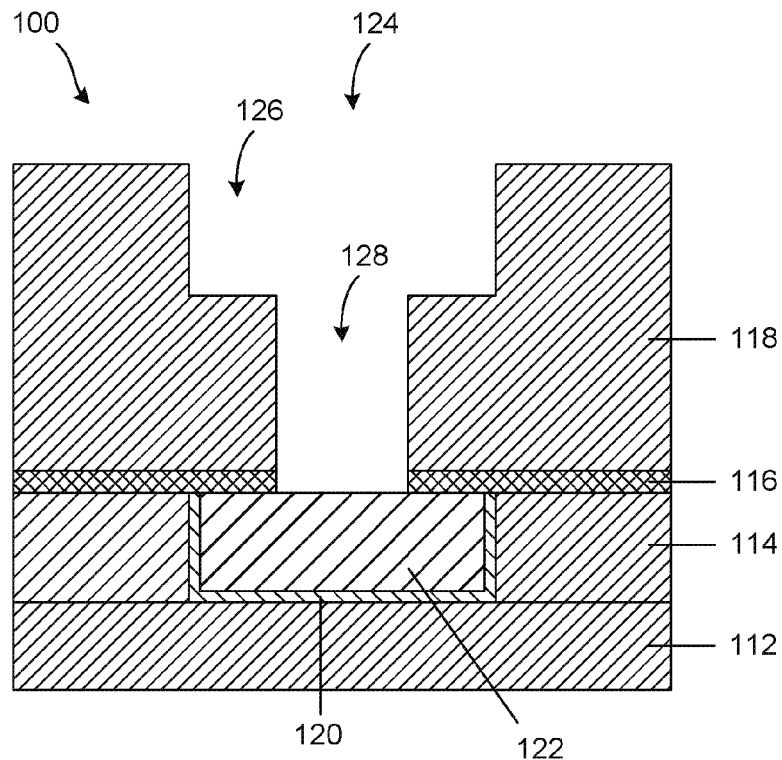
FIGS. 1A-1F schematically show cross-sectional views for forming an interconnect structure within a dual damascene opening according to embodiments of the invention.

Referring now to the drawings, FIGS. 1A-1F schematically shows cross-sectional views for forming an interconnect structure within a dual damascene opening according to embodiments of the invention. FIG. 1A schematically shows a cross-sectional view of an interconnect structure 100 having a dual damascene interconnect opening 124 formed over a conductive interconnect structure 122. Dual damascene interconnect openings are well known to one of ordinary skill in the art of integrated circuit fabrication. The interconnect opening 124 contains a via 128 and a trench 126 formed in dielectric material 118. The trench 126 is for an upper conductive interconnect structure and the via 128 connects the trench 126 to the conductive interconnect structure 122. The interconnect structure 100 further contains dielectric layers 112 and 114, a barrier layer 120 surrounding the conductive interconnect structure 122, and an etch stop layer 116. The conductive interconnect structure 122 can, for example, contain Cu or W.

In FIG. 1A, the dielectric material 118 can contain $SiO_2$, SiON, SiN, or a low dielectric constant (low-k) material having a dielectric constant less than that of $SiO_2$ (k~3.9). Commonly, low-k materials can contain simple or complex compounds of Si, C, or Si and C, in combination with O, N, H, and/or a halogen (F, Cl, Br, or I), either as dense or porous materials. Examples of low-k materials can include C:F-containing materials.

Figure 1B:
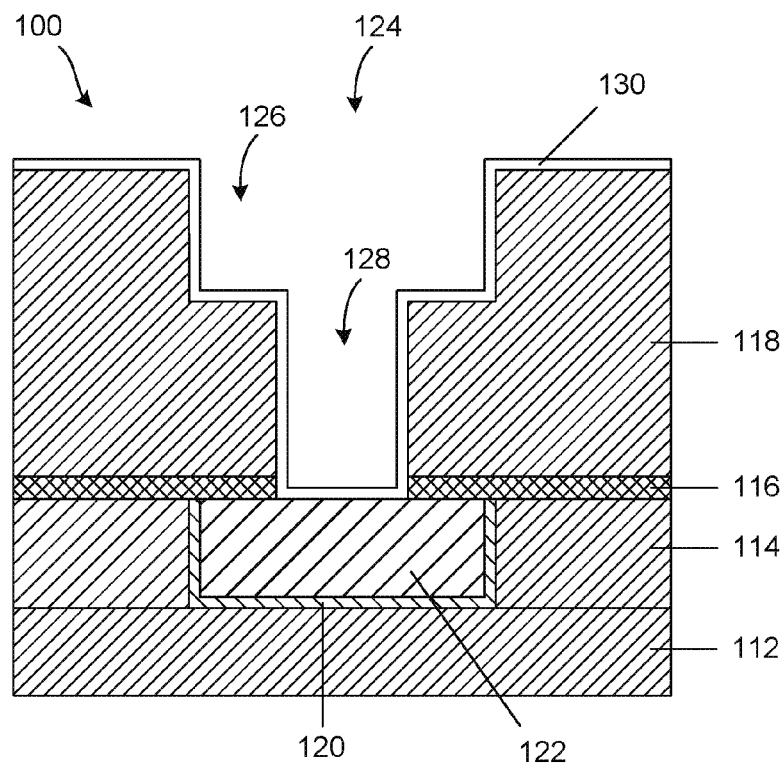

In FIG. 1B, a metallic layer 130 is deposited over the interconnect structure 100, including in the interconnect opening 124 formed within the dielectric material 118 and onto the conductive interconnect structure 122. The metallic layer 130 contains a reactive metal. The reactive metal can be, for example, Co, Ru, Mo, W, or Ir, or a combination thereof. A thickness of the metallic layer 130 can be, for example, about 3 nm ($nm=10^{-9}$ m), or less. In another example, the thickness can be 2 nm, or less. The metallic layer 130 may be deposited by a variety of different deposition methods known to one of ordinary skill in the art, including, but not limited to, sputtering or physical vapor deposition (PVD), chemical vapor deposition (CVD), pulsed CVD, plasma-enhanced CVD (PECVD), atomic layer deposition (ALD), or plasma-enhanced ALD (PEALD). According to one embodiment of the invention, the metallic layer 130 may be deposited by a non-plasma process, e.g., CVD, pulsed CVD, or ALD, to avoid plasma damage to the interconnect structure 100.

Figure 1C:
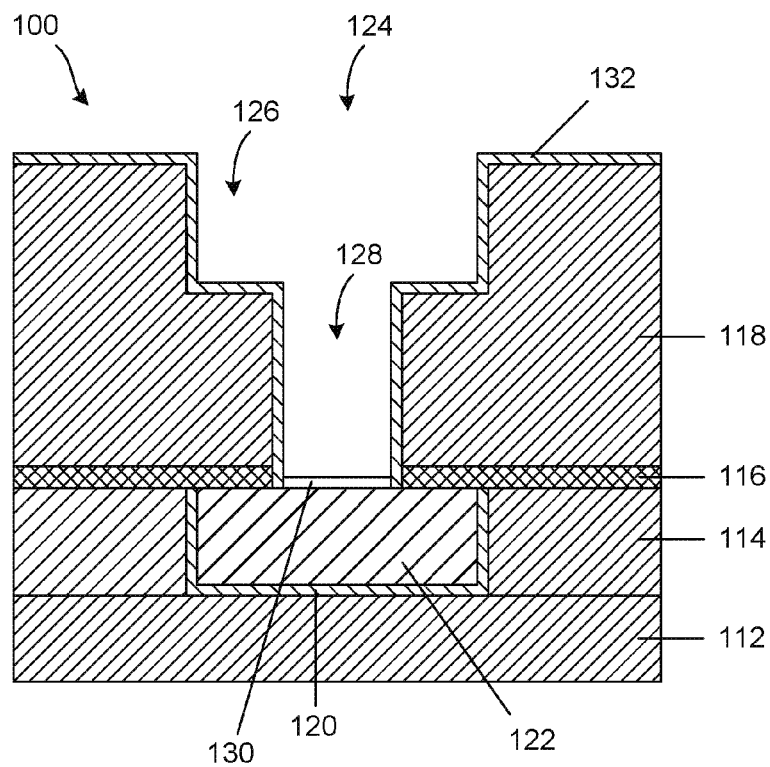

Referring to FIG. 1C, a thermal anneal process is performed by heating the interconnect structure 100 to a temperature between about 100° C. and about 600° C. for a time period between about 1 minute and about 60 minutes. According to one embodiment of the invention, the thermal anneal process may be performed by heating the interconnect structure 100 to a temperature of about 400° C., or less, and maintaining the interconnect structure at that temperature for a time period of less than about 5 minutes. The thermal anneal process may be performed under vacuum conditions and optionally in the presence of an inert gas. Alternatively, the thermal anneal process may be performed in the presence of hydrogen ($H_2$) and optionally an inert gas. During the thermal anneal process, a diffusion barrier 132 is formed by reacting the reactive metal from metallic layer 130 with a dielectric reactant element from the dielectric material 118. According to an embodiment of the invention, the dielectric reactant element can include Si, O, N, C, or a halogen, or a combination thereof. The diffusion barrier 132 formed by the thermal anneal process can contain a metal silicide, a metal silicate, a metal silicon oxynitride, a metal oxide, a metal nitride, a metal carbide, or a metal halide, or a combination thereof, where the metal includes Co, Ru, Mo, W, or Ir, or a combination thereof. In the embodiment depicted in FIG. 1C, the reaction of the reactive metal from metallic layer 130 with a dielectric reactant element from the dielectric material 118 consumes the entire metallic layer 130 in contact with the dielectric material 118. Furthermore, depicted in FIG. 1C is reaction of the metallic layer 130 with the etch stop layer 116, but this is not required as the metallic layer 130 may not react with the etch stop layer 116. According to one embodiment of the invention, the metallic layer 130 and the thermal anneal process form an amorphous diffusion barrier 132. Exemplary thermal anneal conditions include substrate temperature about 400° C., or less and annealing time of 5 min or less. The thermal anneal conditions can further include the use of a process gas containing an inert gas (e.g., a noble gas or $N_2$) or $H_2$ gas, and process gas pressure less than or equal to 760 Torr. Alternately, the annealing process may be performed under high vacuum conditions without the use of a process gas.

The diffusion barrier 132 primarily contains a compound formed from the thermal reaction between the reactive metal from the metallic layer 130 and the dielectric reactant element from the dielectric material 118. In other words, formation of the diffusion barrier 132 is dominated by the interaction between the metallic layer 130 and the dielectric material 118. However, other embodiments of the invention do not preclude utilizing a process gas containing one or more of the same elements as the dielectric reactant elements from the dielectric material 118 (e.g., Si, O, N, C, or a halogen) during the thermal anneal process to further incorporate these elements into the metallic layer 130 to form diffusion barrier compounds. For example, the process gas can contain a silicon precursor (e.g., $SiH_4$, $SiCl_4$, or $Si_2Cl_6$), an oxygen precursor (e.g., $O_2$ or $H_2O$), a nitrogen precursor (e.g., $NH_3$ or $N_2H_4$), an oxygen- and nitrogen-precursor (e.g., NO, $NO_2$, $N_2O$), or a halogen-precursor (e.g., $Cl_2$). Diffusion barrier compounds formed from the reactive metal of metallic layer 130 and an element of a process gas comprise a minor proportion relative to the diffusion barrier compounds formed from the reactive metal of metallic layer 130 and the dielectric reactant element from the dielectric material 118. In one embodiment, diffusion barrier compounds formed from the reactive metal of metallic layer 130 and an element of a process gas comprise less than 30% of the diffusion barrier 132. In another embodiment, diffusion barrier compounds formed from the reactive metal of metallic layer 130 and an element of a process gas comprise less than 20% of the diffusion barrier 132. In yet another embodiment, diffusion barrier compounds formed from the reactive metal of metallic layer 130 and an element of a process gas comprise less than 10% of the diffusion barrier 132.

Figure 1D:
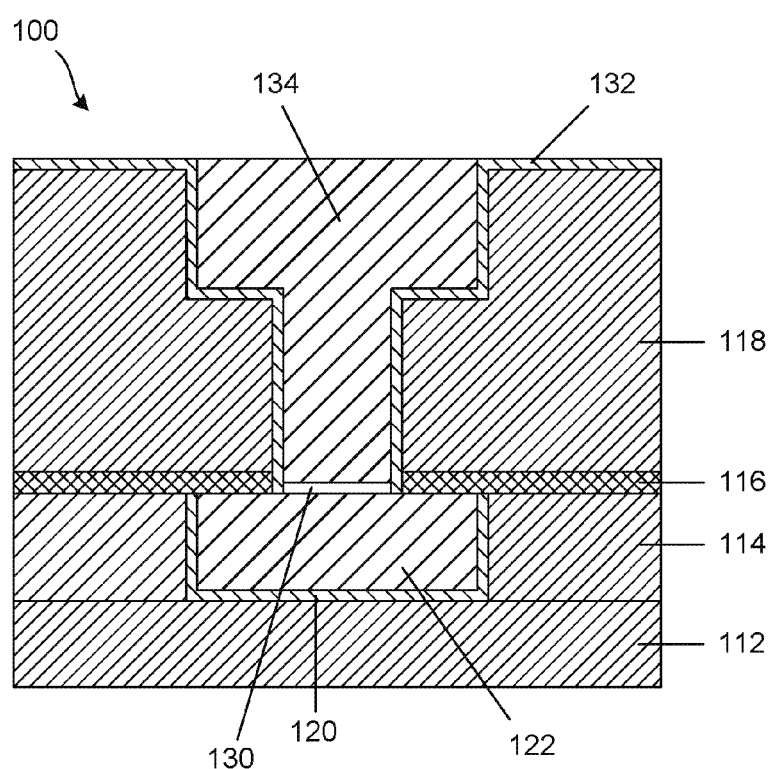

In FIG. 1D, the interconnect opening 124 is filled with Cu metal 134. Cu filling process are known to one of ordinary skill in the art of circuit fabrication and can, for example, include an electrochemical plating process or an electroless plating process. The Cu metal 134 is surrounded within the interconnect opening 124 by the diffusion barrier 132 and an unreacted portion of the metallic layer 130 at the bottom of the via 128 in contact with the conductive interconnect structure 122. According to one embodiment of the invention, a Cu seed layer may be deposited onto the diffusion barrier 132 and the unreacted portion of the metallic layer 130 prior to the Cu filling process.

Figure 1E:
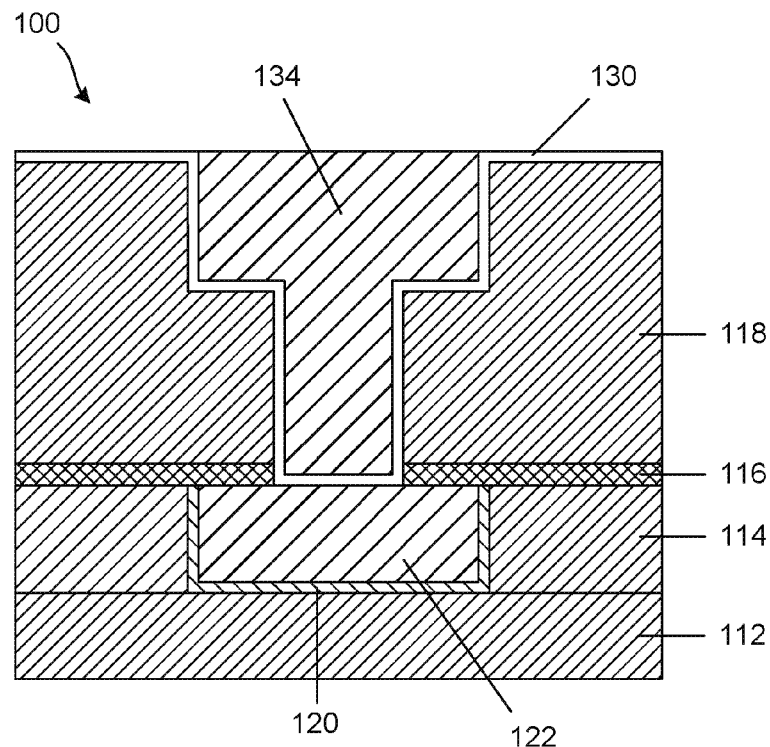

According to another embodiment of the invention, the interconnect opening 124 depicted in FIG. 1B may be filled with Cu metal 134 prior to the thermal anneal process. FIG. 1E shows the interconnect structure 100 containing a metallic layer 130 and Cu metal 134 filling the interconnect opening 124. Next, a thermal anneal process may be performed to form the interconnect structure 100 depicted in FIG. 1D, where the diffusion barrier 132 is formed by reaction of the reactive metal from metallic layer 130 with a dielectric reactant element from the dielectric material 118.

Figure 1F:
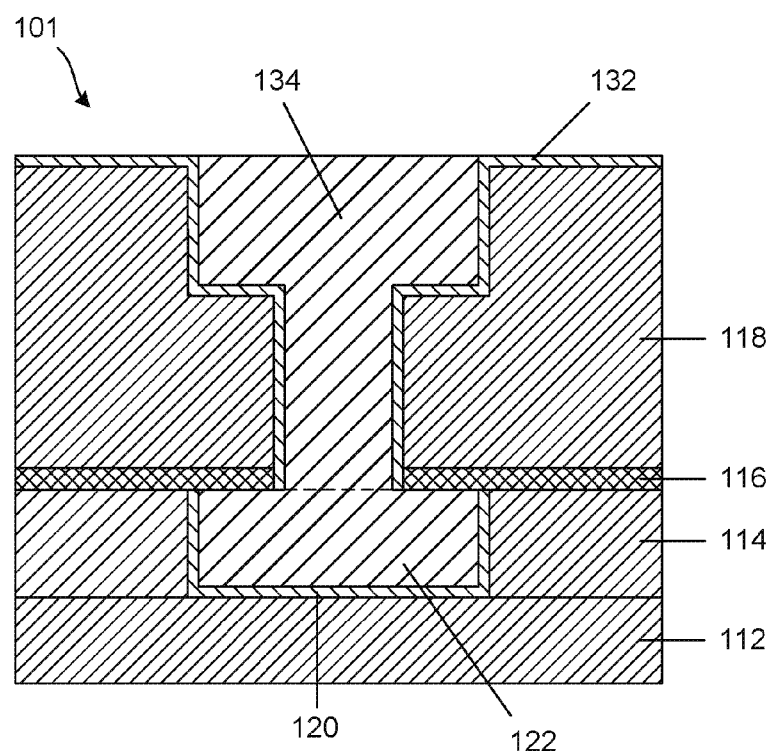

According to another embodiment of the invention, the unreacted portion of the metallic layer 130 at the bottom of the via 128 depicted in FIG. 1C may be removed by a sputter etch process or by a chemical etching process prior to the Cu fill process, in order to reduce the electrical resistance between the Cu metal 134 and the conductive interconnect structure 122. The chemical etching process may include a dry etching process or a wet etching process. In one example, a chemical etching process may be utilized that has a higher etch rate towards the metallic layer 130 than towards the diffusion barrier 132. For example, in the case of a cobalt silicide (CoSi) diffusion barrier 132, a mixture of $NH_4OH$ and $H_2O_2$ may be utilized for selectively removing unreacted Co metal 130 at the bottom of the via 128. FIG. 1F shows an interconnect structure 101 where the unreacted portion of the metallic layer 130 at the bottom of the via 128 has been removed prior to the Cu fill process, thereby directly contacting the Cu metal 134 and the conductive interconnect structure 122 and reducing the electrical resistance of the interconnect structure 101 compared to the interconnect structure 100 depicted in FIG. 1D.

Figure 2A:
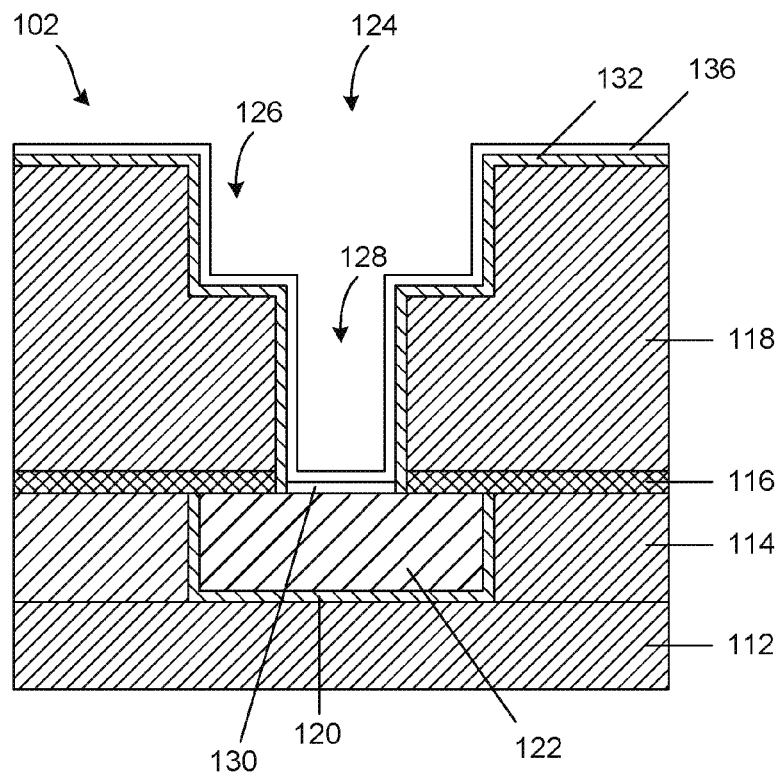
FIGS. 2A-2E schematically show cross-sectional views for forming an interconnect structure within a dual damascene opening according to embodiments of the invention.
Figure 2B:
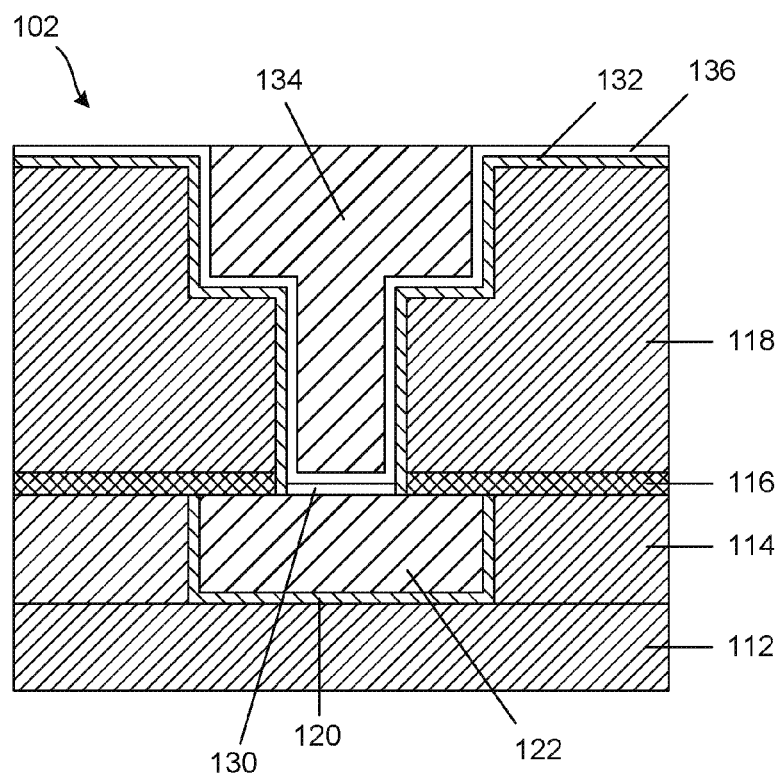

FIGS. 2A-2E schematically show cross-sectional views for forming an interconnect structure within a dual damascene opening according to an embodiment of the invention. FIG. 2A schematically shows a cross-sectional view of an interconnect structure 102 that is similar to the interconnect structure 100 depicted in FIG. 1C but further contains a Ru seed layer 136 deposited onto the diffusion barrier 132 and the unreacted portion of the metallic layer 130 at the bottom of the via 128. For example, the Ru seed layer 136 may be deposited by sputtering or a CVD process using $Ru_3(CO)_{12}$. The Ru seed layer 136 may enhance the Cu plating process and the electronic properties of the completed interconnect structure 101. In FIG. 2B, the interconnect opening 124 is filled with Cu metal 134.

Figure 2C:
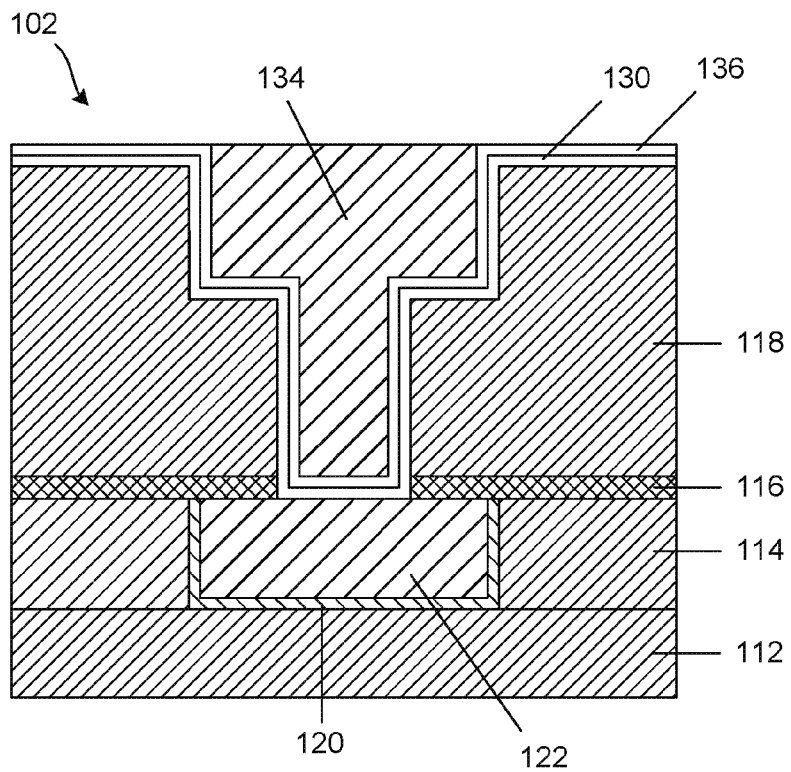

According to another embodiment of the invention, the Ru seed layer 136 may be deposited onto the metallic layer 130 and the interconnect opening 124 filled Cu metal 134 prior to the thermal anneal process. FIG. 2C shows the interconnect structure 102 containing a metallic layer 130, Ru seed layer 136, and Cu metal 134 filling the interconnect opening 124. Next, a thermal anneal process may be performed to form the interconnect structure 102 depicted in FIG. 2B, where the diffusion barrier 132 is formed by reaction of the reactive metal from metallic layer 130 with a dielectric reactant element from the dielectric material 118.

Figure 2D:
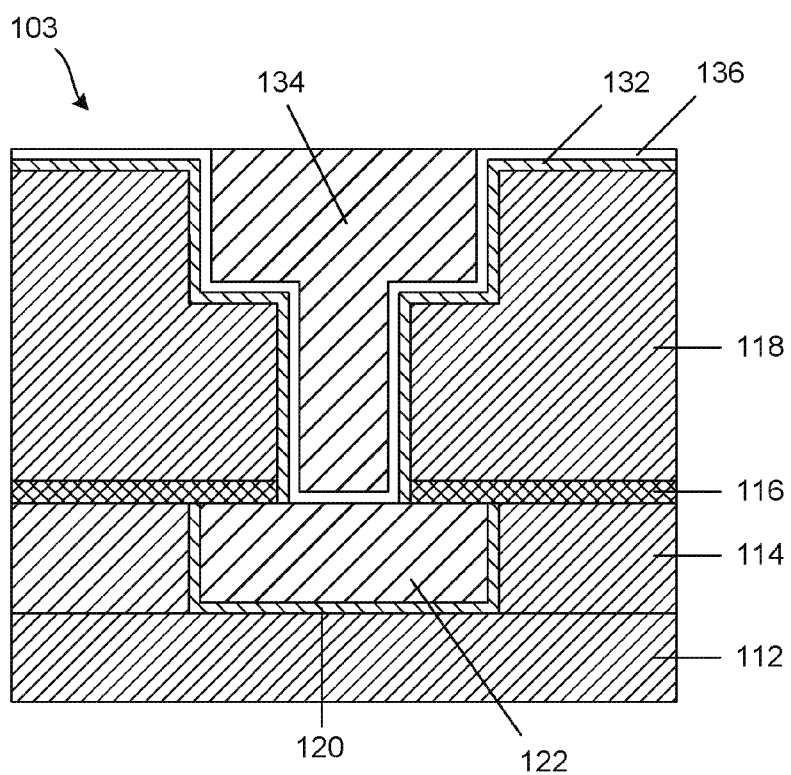

According to another embodiment of the invention, the unreacted portion of the metallic layer 130 at the bottom of the via 128 may be removed prior to depositing the Ru seed layer 136, in order to reduce the electrical resistance between the Cu metal 134 and the conductive interconnect structure 122. FIG. 2D shows an interconnect structure 103 where the unreacted portion of the metallic layer 130 at the bottom of the via 128 has been removed prior to depositing the Ru seed layer 136, thereby directly contacting the conductive interconnect structure 122 to the Ru seed layer 136.

Figure 2E:
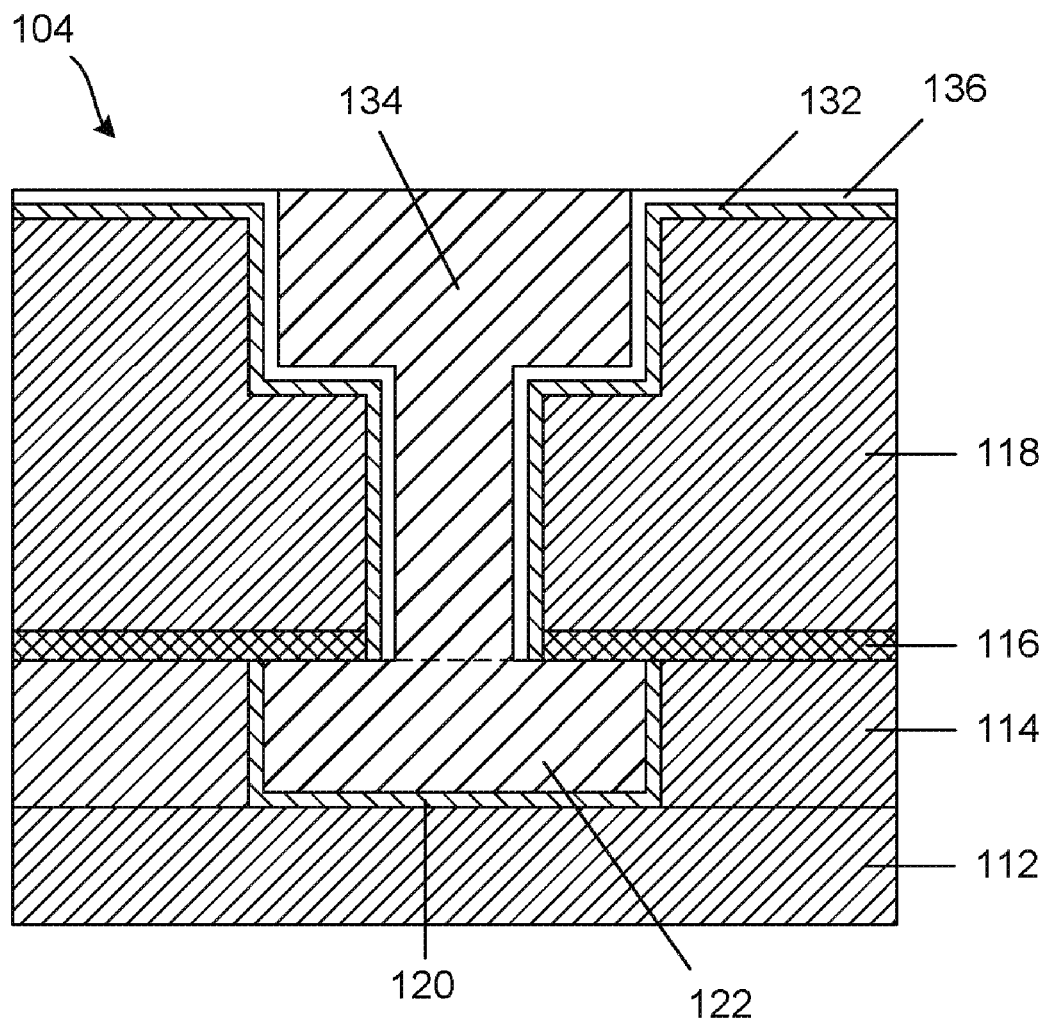

According to another embodiment of the invention, the unreacted portion of the metallic layer 130 and the Ru seed layer 136 at the bottom of the via 128 may be removed prior to the Cu fill process, thereby directly contacting the Cu metal 134 and the conductive interconnect structure 122. FIG. 2E shows an interconnect structure 104 where the unreacted portion of the metallic layer 130 and the Ru seed layer 136 at the bottom of the via 128 have been removed prior to the Cu fill process. Although not shown in FIG. 2E, removal of the Ru seed layer 136 from the bottom of the via 128 may at least partially remove the Ru seed layer from other surfaces of the interconnect structure 104.

Figure 3A:
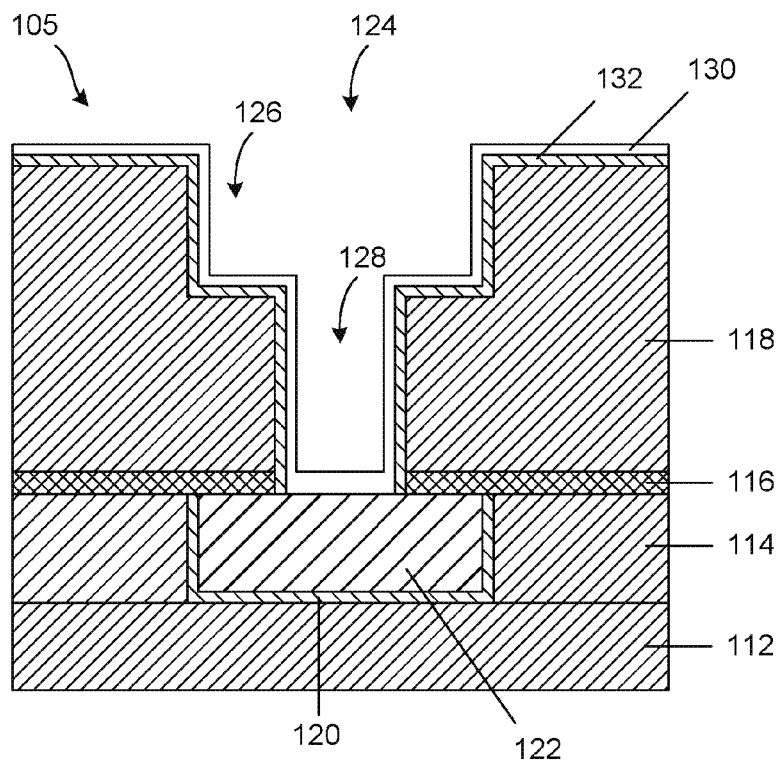
FIGS. 3A-3D schematically show cross-sectional views for forming an interconnect structure within a dual damascene opening according to embodiments of the invention.
Figure 3B:
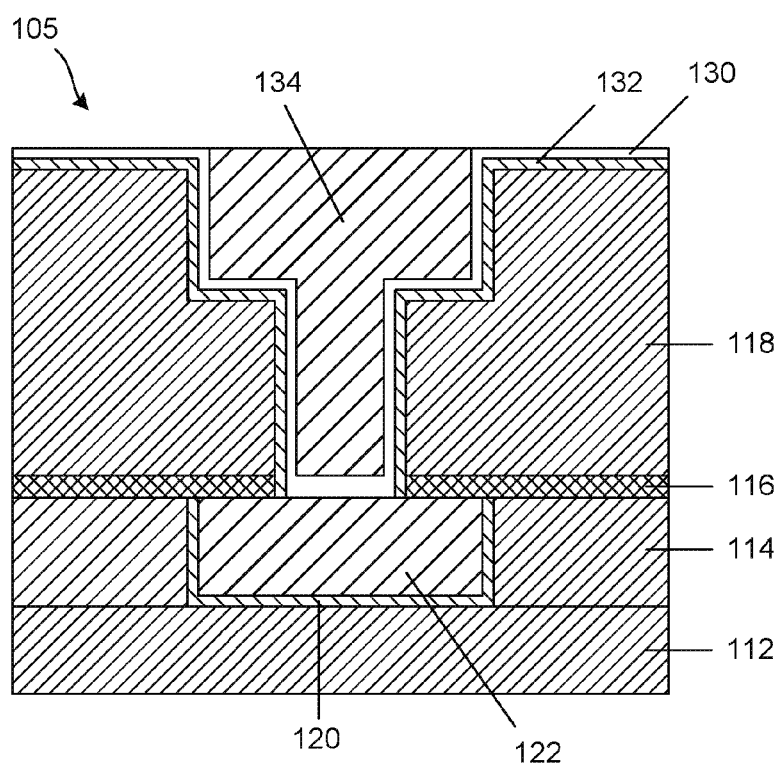

FIGS. 3A-3B schematically shows cross-sectional views for forming an interconnect structure within a dual damascene opening according to embodiments of the invention. FIG. 3A schematically shows a cross-sectional view of an interconnect structure 105 that is similar to the interconnect structure 100 depicted in FIG. 1C but an unreacted portion of the metallic layer 130 remains on the diffusion barrier 132. In one example, the interconnect structure 105 may be formed by depositing a thick metallic layer 130 that is not fully consumed by reaction of the reactive metal therein and a dielectric reactant element during the thermal anneal process. In another example, the interconnect structure 105 may be formed by a thermal anneal process that is performed at a lower temperature or for a shorter processing time than the interconnect structure 100. In yet another example, the interconnect structure 105 may contain a different metal element than the interconnect structure 100. In FIG. 3B, the interconnect opening 124 is filled with Cu metal 134.

Figure 3C:
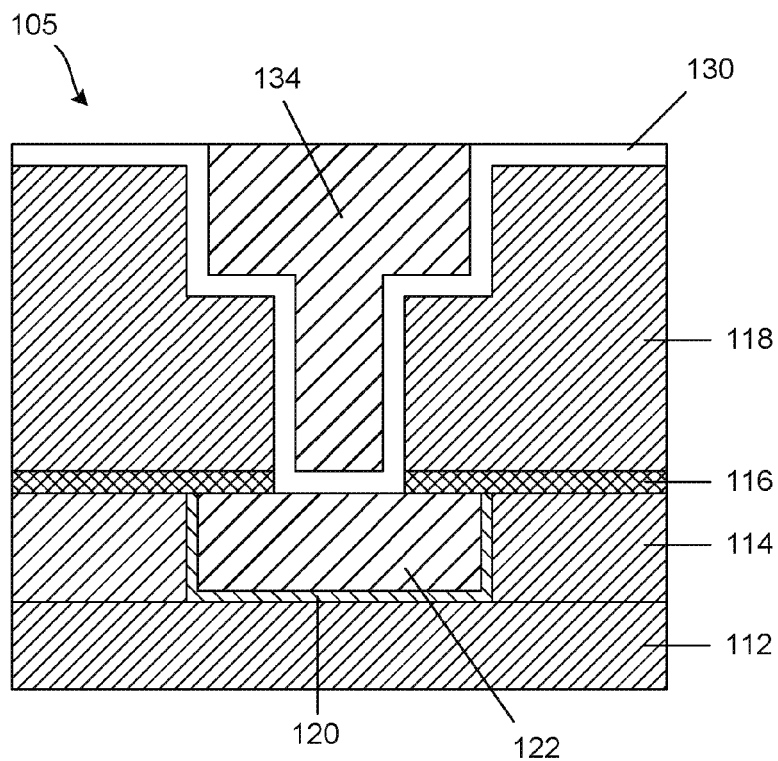

According to another embodiment of the invention, the interconnect opening 124 may be filled with Cu metal 134 prior to the thermal anneal process. FIG. 3C shows the interconnect structure 105 containing a metallic layer 130 and Cu metal 134 filling the interconnect opening 124. Next, a thermal anneal process may be performed to form the interconnect structure 100 depicted in FIG. 3B, where the diffusion barrier 132 is formed by reacting a first portion of a thickness of the metallic layer 130 with a dielectric reactant element from the dielectric material 118 while a second portion of the thickness of the metallic layer 130 on the diffusion barrier 132 remains unreacted and in contact with the Cu metal 134.

Figure 3D:
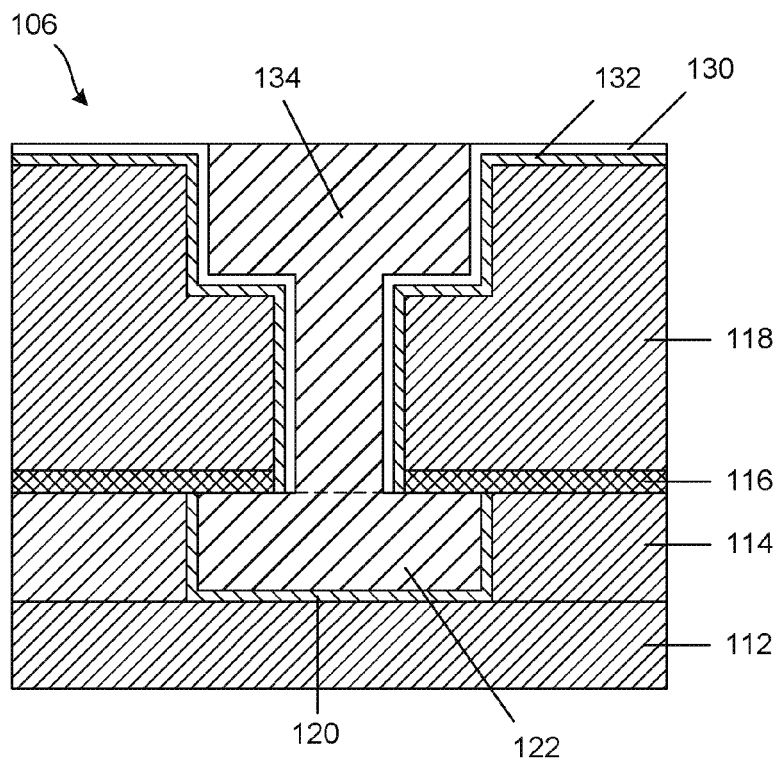

According to another embodiment of the invention, the unreacted portion of the metallic layer 130 at the bottom of the via 128 may be removed prior to the Cu fill process, in order to reduce the electrical resistance between the Cu metal 134 and the conductive interconnect structure 122. FIG. 3D shows an interconnect structure 106 where the unreacted portion of the metallic layer 130 at the bottom of the via 128 has been removed prior to the Cu fill process, thereby directly contacting the Cu metal 134 and the conductive interconnect structure 122 and reducing the electrical resistance of the interconnect structure 106 compared to the interconnect structure 105 depicted in FIG. 3B. Although not shown in FIG. 3D, removal of the unreacted portion of the metallic layer 130 from the bottom of the via 128 may at least partially remove the metallic layer 130 from other surfaces of the interconnect structure 106.

Figure 4A:
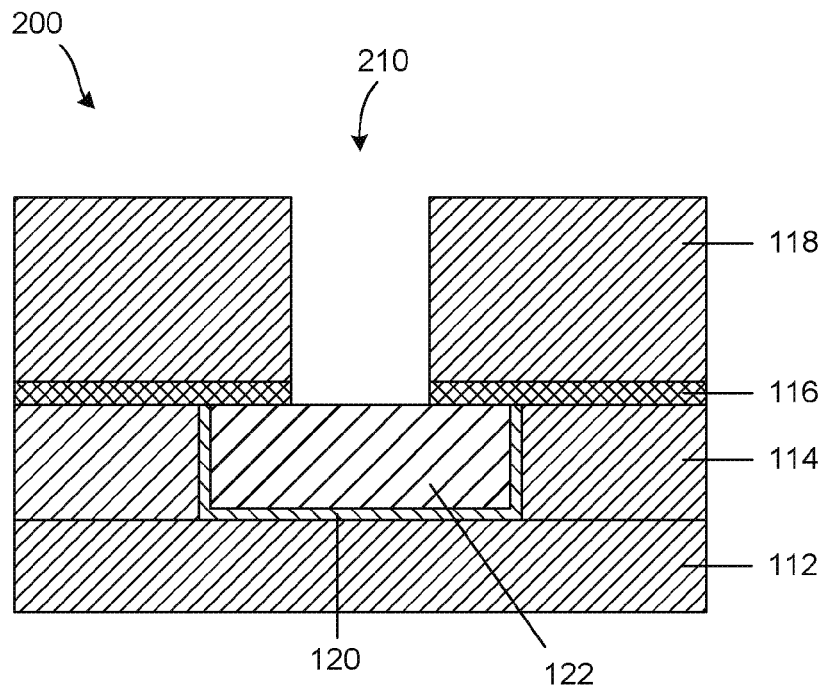
FIGS. 4A-4B schematically show cross-sectional views of interconnect structures according to embodiments of the invention.
Figure 4B:
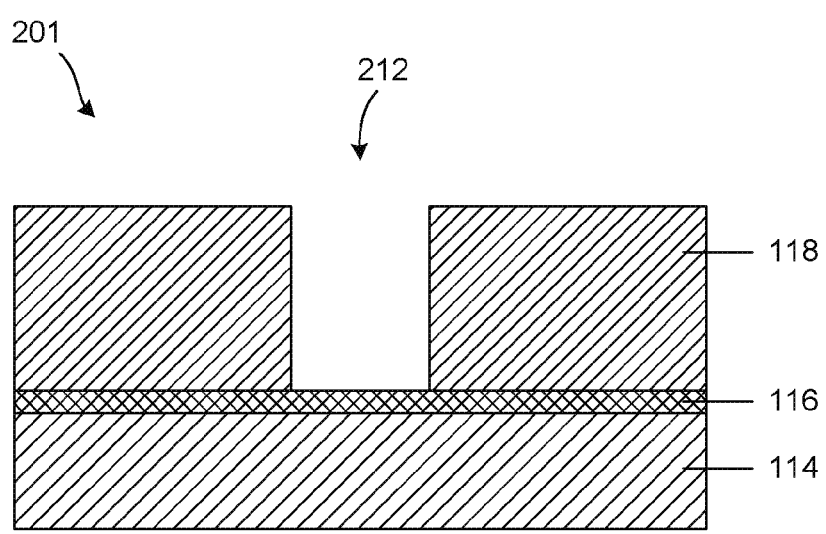

A dual damascene opening is illustrated in the exemplary embodiments of FIGS. 1-3, but embodiments of the invention may be applied to other types of openings found in integrated circuit design. In one example, FIG. 4A schematically shows a cross-sectional view of a via interconnect structure according to one embodiment of the invention. The interconnect structure 200 is similar to the interconnect structure 100 depicted in FIG. 1A but contains a via 210 within the dielectric material 118 over conductive interconnect structure 122. In another example, FIG. 4B schematically shows a cross-sectional view of a trench interconnect structure according to one embodiment of the invention. The trench interconnect structure 201 contains a trench 212 within the dielectric material 118. As will be appreciated by those skilled in the art, embodiments of the invention can be readily applied to the interconnect structures depicted in FIGS. 4A-4B. Specifically, a metallic layer 130 containing reactive metal may be deposited over the via 210 or trench 212 and then thermally annealed to react the reactive metal with a dielectric reactant from the dielectric material 118 to form a diffusion barrier 132, either before or after filling the via 210 or trench 212 with Cu metal 134.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for fabricating an interconnect structure, the method comprising:
   depositing a metallic layer comprising a reactive metal directly onto a dielectric material in an interconnect opening formed within the dielectric material, wherein the dielectric material comprises a dielectric reactant element;
   thermally reacting at least a portion of the metallic layer with at least a portion of the dielectric material onto which the metallic layer was directly deposited to form a diffusion barrier primarily comprising a compound of the reactive metal from the metallic layer and the dielectric reactant element from the dielectric material; and
   filling the interconnect opening with Cu metal, wherein the diffusion barrier surrounds the Cu metal within the interconnect opening.

2. The method of claim 1, wherein the reactive metal is Co, Ru, Mo, W, or Ir, or a combination thereof.

3. The method of claim 1, wherein the dielectric reactant element is Si, O, N, C, or a halogen, or a combination thereof.

4. The method of claim 3, wherein the dielectric material comprises $SiO_2$, SiON, SiN, or a low-k material.

5. The method of claim 3, wherein the diffusion barrier comprises a metal silicide, a metal silicate, a metal silicon oxynitride, a metal oxide, a metal nitride, a metal carbide, a metal halide, or a combination thereof.

6. The method of claim 1, wherein the thermally reacting comprises:
   thermally reacting a first portion of a thickness of the metallic layer with at least a portion of the dielectric material while a second portion of the thickness of the metallic layer on the diffusion barrier remains unreacted.

7. The method of claim 1, further comprising:
   depositing a Cu or Ru seed layer prior to the filling.

8. The method of claim 1, wherein the interconnect opening comprises a conductive interconnect structure at the bottom of the interconnect opening and wherein the metallic layer is deposited directly onto the conductive interconnect structure at the bottom of the interconnect opening.

9. The method of claim 8, further comprising:
   removing by dry etching or wet etching the metallic layer from the bottom of the interconnect opening where directly deposited onto the conductive interconnect structure prior to the filling.

10. The method of claim 8, further comprising:
    depositing a Ru seed layer; and
    removing the Ru seed layer from the bottom of the interconnect opening prior to the filling.

11. The method of claim 1, wherein the interconnect opening comprises a trench, a via, or a dual damascene opening.

12. The method of claim 1, wherein the diffusion barrier has a thickness of 3 nm or less.

13. A method for fabricating an interconnect structure, the method comprising:
    providing a substrate having an interconnect opening formed within a dielectric material, the dielectric material comprising a dielectric reactant element selected from Si, O, N, C, or halogen, or a combination thereof;
    depositing a metallic layer directly onto the dielectric material in the interconnect opening formed within the dielectric material, wherein the metallic layer comprises a reactive metal selected from Co, Ru, Mo, W, or Ir, or a combination thereof;
    thermally annealing the substrate to react the reactive metal in at least a portion of the metallic layer with the dielectric reactant element in at least a portion of the dielectric material onto which the metallic layer was directly deposited to form a diffusion barrier comprising a compound selected from a silicide of the reactive metal, a silicate of the reactive metal, a silicon oxynitride of the reactive metal, an oxide of the reactive metal, a nitride of the reactive metal, a carbide of the reactive metal, or a halide of the reactive metal, or a combination thereof, wherein the compound primarily comprises the reactive metal from the metallic layer and the dielectric reactant element from the dielectric material; and filling the interconnect opening with Cu metal, wherein the diffusion barrier surrounds the Cu metal within the interconnect opening.

14. An interconnect structure, comprising:
an interconnect opening formed within a dielectric material;
a diffusion barrier on the dielectric material, the diffusion barrier primarily comprising a compound from a thermal reaction between a reactive metal from a metallic layer formed directly on the dielectric material and a dielectric reactant element from the dielectric material; and
a Cu metal fill in the interconnect opening, wherein the diffusion barrier surrounds the Cu metal fill within the interconnect opening.

15. The interconnect structure of claim 14, wherein the reactive metal is Co, Ru, Mo, W, or Ir, or a combination thereof.

16. The interconnect structure of claim 14, wherein the dielectric reactant element is Si, O, N, C, or halogen, or a combination thereof.

17. The interconnect structure of claim 16, wherein the dielectric material comprises $SiO_2$, SiON, SiN, or a low-k material.

18. The interconnect structure of claim 16, wherein the compound is a metal silicide, a metal silicate, a metal silicon oxynitride, a metal oxide, a metal nitride, or a metal carbide, or a combination thereof.

19. The interconnect structure of claim 14, further comprising an unreacted portion of the metallic layer between the diffusion barrier and the Cu metal fill.

20. The interconnect structure of claim 14, further comprising:
a Ru seed layer located between the diffusion barrier and the Cu metal fill.

21. The interconnect structure of claim 14, wherein the interconnect opening comprises a trench, a via, or a dual damascene opening.

22. The interconnect structure of claim 14, wherein the diffusion barrier has a thickness of 3 nm or less.

23. The interconnect structure of claim 14, wherein the interconnect opening comprises a conductive interconnect structure at the bottom of the interconnect opening.

24. The interconnect structure of claim 23, wherein the conductive interconnect structure is in direct contact with the Cu metal fill.

25. The interconnect structure of claim 23, further comprising an unreacted portion of the metallic layer located between the conductive interconnect structure and the Cu metal fill.

26. The interconnect structure of claim 25, further comprising a Ru seed layer located between the unreacted portion of the metallic layer and the Cu metal fill.

27. The interconnect structure of claim 23, further comprising a Ru seed layer located between and in direct contact with the conductive interconnect structure and the Cu metal fill.

* * * * *